US011183978B2

(12) United States Patent
Zota et al.

(10) Patent No.: US 11,183,978 B2
(45) Date of Patent: Nov. 23, 2021

(54) LOW-NOISE AMPLIFIER WITH QUANTIZED CONDUCTION CHANNEL

(71) Applicant: International Business Machines Corporation, Armonk, NY (US)

(72) Inventors: Cezar Bogdan Zota, Rueschlikon (CH); Lukas Czornomaz, Zurich (CH)

(73) Assignee: International Business Machines Corporation, Armonk, NY (US)

(*) Notice: Subject to any disclaimer, the term of this patent is extended or adjusted under 35 U.S.C. 154(b) by 83 days.

(21) Appl. No.: 16/433,163

(22) Filed: Jun. 6, 2019

(65) Prior Publication Data

US 2020/0389134 A1 Dec. 10, 2020

(51) Int. Cl.
| | |
|---|---|
| *H03F 3/193* | (2006.01) |
| *G06N 10/00* | (2019.01) |
| *H01L 29/775* | (2006.01) |
| *H01L 29/778* | (2006.01) |
| *H03F 1/30* | (2006.01) |

(Continued)

(52) U.S. Cl.
CPC ............. *H03F 3/193* (2013.01); *G06N 10/00* (2019.01); *H01L 29/775* (2013.01); *H01L 29/778* (2013.01); *H03F 1/301* (2013.01); *H03F 1/523* (2013.01); *H03F 3/21* (2013.01); *H03F 2200/294* (2013.01)

(58) Field of Classification Search
CPC . H03F 3/193; H03F 1/523; H03F 3/21; H03F 1/301; H03F 2200/294; G06N 10/00; H01L 29/775; H01L 29/778
USPC ........ 330/307, 277, 136, 289, 298, 302, 296
See application file for complete search history.

(56) References Cited

U.S. PATENT DOCUMENTS

| | | | | |
|---|---|---|---|---|
| 6,111,466 A | * | 8/2000 | Mokhtar | ................. H03F 3/193 330/296 |
| 2006/0065914 A1 | * | 3/2006 | Chen | ................. H01L 29/66636 257/288 |

(Continued)

FOREIGN PATENT DOCUMENTS

KR          20040090524 A          10/2004

OTHER PUBLICATIONS

De Blasi M. et al. "A Monolithic CMOS Automatic Biasing System for 40GHz Multistage HEMT" Circuits and Systems (ISCAS), 2013 IEEE International Symposium on IEEE, May 19, 2013, pp. 1708-1711, XP032446266, DOI 10.1109/ISCAS. 2013.6572193. ISBN: 978-1-4673-5760-9.

(Continued)

*Primary Examiner* — Khanh V Nguyen
*Assistant Examiner* — Khiem D Nguyen
(74) *Attorney, Agent, or Firm* — Harrington & Smith (57) ABSTRACT

An amplifier, e.g., a low-noise amplifier, includes a field-effect transistor having a one-dimensional channel. This channel includes a semiconductor material for conducting electrons along a main direction of the channel. This direction is perpendicular to a cross-section of the channel. Dimensions of this cross-section are, together with the semiconductor material, such that the channel exhibits quantized conduction of electrons along its main direction. The amplifier further includes an electrical circuit that is configured to operate the transistor at a value of gate-to-source voltage bias corresponding to a peak value of a peak of a transconductance of the channel with respect to gate-to-source voltage bias values.

23 Claims, 7 Drawing Sheets

(51) Int. Cl.
H03F 1/52 (2006.01)
H03F 3/21 (2006.01)

(56) References Cited

U.S. PATENT DOCUMENTS

2008/0204149 A1 8/2008 Suzuki et al.
2012/0198591 A1 8/2012 Ohnesorge
2013/0249628 A1 9/2013 Rawson et al.

OTHER PUBLICATIONS

Kristensen A. et al. "Quantum Point Contacts formed in GaAs/GaAlAs Hetrostructures by Shallow Etching and Overgrowth" Solid State Electronics, Elsevier Science Publishers, Barking, GB, vol. 42, No. 7-8, Jul. 8, 1998, pp. 1103-1107, XP004133425, ISSN: 0038-1101, DOI: 10.1016/S0038-1101 (97)00310-9.
Zota Cezar B. et al. "Conductance Quantization in Quasiballistic InGaAs Nanowire MOSFETS" 2015 73rd Annual Device Research Conference (DRC), IEEE, Jun. 21, 2015, pp. 257-258, XP033188825, DOI: 10.1109/DRC.2015.7175667. ISBN: 978-1-4673-8134-5 [retrieved on Aug. 3, 2015].

* cited by examiner

LOW-NOISE AMPLIFIER WITH QUANTIZED CONDUCTION CHANNEL

BACKGROUND

The exemplary embodiments described herein relate in general to the field of amplifiers (e.g., low-noise amplifiers) and transistors for such amplifiers. The exemplary embodiments described herein are further directed to an apparatus comprising such an amplifier, such as a quantum information processing hardware apparatus, as well as related methods of operation. In particular, the embodiments rely on a field-effect transistor exhibiting a quantized conduction channel.

Electronic amplifiers are well-known devices, which today mostly rely on transistors to increase the power of a signal (e.g., a time-varying signal such as a voltage or a current signal). Low-noise amplifiers (LNAs), in particular LNAs operating at cryogenic temperatures (10 K and below), are used in a variety of applications. They are for instance needed for applications in astronomy, experimental physics, telecommunications, and, in particular, in quantum computers (for readout purposes).

In that respect, particularly promising quantum computing apparatuses have been demonstrated, which are based on superconducting qubits of the transmon type. Such qubits are controlled by radio frequency (RF) technology and need be operated at a temperature of a few mK only. RF signals are fed into the cryostat with coax cables using attenuators placed on intermediate temperature platforms to achieve suitable signal power. On the return path, qubit signals need be amplified for readout purposes.

LNAs are usually based on standard high-electron-mobility transistor (HEMT) technology. In quantum computer applications, the design of LNAs can be optimized by taking into account cryogenic effects, primarily on mobility and resistances, and so as to achieve lowest possible noise temperature or highest possible transconductance efficiency.

SUMMARY

According to a first aspect, an amplifier, e.g., a low-noise amplifier, comprises a field-effect transistor having a one-dimensional (1D) channel. This channel includes a semiconductor material for conducting electrons along a main direction of the channel. This direction is perpendicular to a cross-section of the channel. Dimensions of this cross-section are, together with the semiconductor material, such that the channel exhibits quantized conduction of electrons along its main direction. The amplifier further comprises an electrical circuit that is configured to operate the transistor at a value of gate-to-source voltage bias corresponding to a peak value of a peak of a transconductance of the channel with respect to gate-to-source voltage bias values.

This amplifier may further include a gain control device and an impedance matching network. The gain control device, the impedance matching network, and the amplifier may all be integrated in a same device, as part of a same electrical circuit. A tracking circuit may further be provided (as part of the electrical circuit of the amplifier) to identify the exact voltage value corresponding to the transconductance peak and set the amplifier for it to operate at the identified gate voltage bias. This amplifier may notably be embodied as a cryogenic, low-noise amplifier (LNA).

As explained above, this amplifier is designed so as to be operated at (or close to) a transconductance peak value, in order to increase the transconductance efficiency. The proposed amplifier is thus able to markedly exceed noise performance of traditional amplifiers, while also dissipating less power, in particular when operated at cryogenic temperatures, which makes it ideal for quantum computer applications. Such an amplifier may, however, also be exploited in other applications, such as in astronomy, experimental physics, or telecommunications.

In embodiments, the electrical circuit of the amplifier is configured to operate it at a value of gate-to-source voltage bias corresponding to a peak value of a first peak of transconductance of the channel, where this first peak corresponds to a first conduction sub-band of the semiconducting channel. This makes it possible to maximize the transconductance efficiency.

The above amplifier may possibly comprise two or more 1D channels for conducting electrons along respective directions, where each of such channels is similar to 1D channel described above. That is, dimensions of respective cross-sections of the channels are, together with their respective semiconductor material, such that the channels exhibit, each, quantized conduction of electrons along their respective directions. In that case, the electrical circuit of the amplifier is configured to operate the amplifier at a same value of gate-to-source voltage bias, i.e., corresponding to a peak value of a peak of a transconductance of each of the channels.

The amplifier is preferably designed so as to be operated at a temperature of less than or equal to 10 K, e.g., for applications to quantum computer hardware.

In preferred embodiments, the average dimension of the cross-section of the channels is less than or equal to 30 nanometers (nm). E.g., it may have a 30 nm×30 nm square cross-section or a circular cross-section with a diameter of 30 nm.

The semiconductor material used to create the channels preferably comprises a III-V semiconductor material (e.g., an InGaAs compound), to allow larger channel cross-sections (all things otherwise equal), while still enabling quantized conduction. Note, the semiconductor material and the raised portions may possibly comprise, each, a III-V semiconductor material. However, the III-V materials will differ at least in an amount of dopants included therein.

For example, preferred designs of the amplifier are based on a field-effect transistor that includes: a substrate, a layer of said semiconductor material, which extends on top of the substrate and is structured so as to form said channel; an insulating layer portion in contact with the semiconductor material layer; raised source and drain contact layer portions, which extend on top of the channel, respectively on opposite sides of the insulating layer portion; a dielectric material covering the raised portions; and a gate metal embedded in the dielectric material and reaching said insulating layer portion.

The gate metal may notably comprise Ti, Pd, Au, Cu, and/or TiN. The insulating layer portion may for instance comprise $Al_2O_3$ or $HFO_2$.

In embodiments, the amplifier further comprises spacers that protrude from the semiconductor layer and extend laterally along sidewalls of said insulating layer portion, between the raised portions.

According to another aspect, an apparatus comprises one or more amplifiers such as described in reference to the first aspect. Each amplifier is configured to amplify signals transmitted in or by the apparatus, in operation thereof. Again, the amplifier(s) is(are) preferably configured as low-noise amplifier(s).

In particularly preferred embodiments, this apparatus is a quantum computer hardware apparatus, preferably comprising superconducting qubits, e.g., of the transmon type. One or more amplifiers such as described above may for instance be arranged on a return signal path, so as to amplify radio-frequency signals returned from one or more of the qubits, in operation.

According to another aspect, a method of operating an amplifier relies on an amplifier that includes a field-effect transistor having a 1D conduction channel. I.e., the channel comprises a semiconductor material for conducting electrons along a main direction thereof, perpendicular to a cross-section of the channel. As evoked earlier, dimensions of said cross-section are, together with this semiconductor material, such that the channel exhibits quantized conduction of electrons along its main direction.

The method basically amounts to operating the transistor at a value of gate-to-source voltage bias corresponding to a peak value of a peak of a transconductance of the channel with respect to gate-to-source voltage bias values. The amplifier is preferably operated at a value of the gate-to-source voltage bias corresponding to a peak value of a first peak of transconductance of the channel, the first peak corresponding to a first conduction sub-band of the semiconductor material.

In embodiments, the method further comprises identifying said value of gate-to-source voltage bias prior to setting the amplifier for it to operate at the identified value of gate-to-source voltage bias. A tracking process may be involved.

The amplifier may for example be operated at a temperature of less than or equal to 10 K, e.g., so as to amplify a superconducting qubit readout signal of a quantum information processing apparatus.

Amplifiers, apparatuses, and methods embodying the present invention will now be described, by way of non-limiting examples, and in reference to the accompanying drawings.

BRIEF DESCRIPTION OF SEVERAL VIEWS OF THE DRAWINGS

The accompanying figures, where like reference numerals refer to identical or functionally similar elements throughout the separate views, and which together with the detailed description below are incorporated in and form part of the present specification, serve to further illustrate various embodiments and to explain various principles and advantages all in accordance with the present disclosure, in which.

The accompanying drawings show simplified representations of devices or parts thereof, as involved in embodiments. Technical features depicted in the drawings are not necessarily to scale. Similar or functionally similar elements in the figures have been allocated the same numeral references, unless otherwise indicated.

DETAILED DESCRIPTION OF EMBODIMENTS OF THE INVENTION

Figure 1:
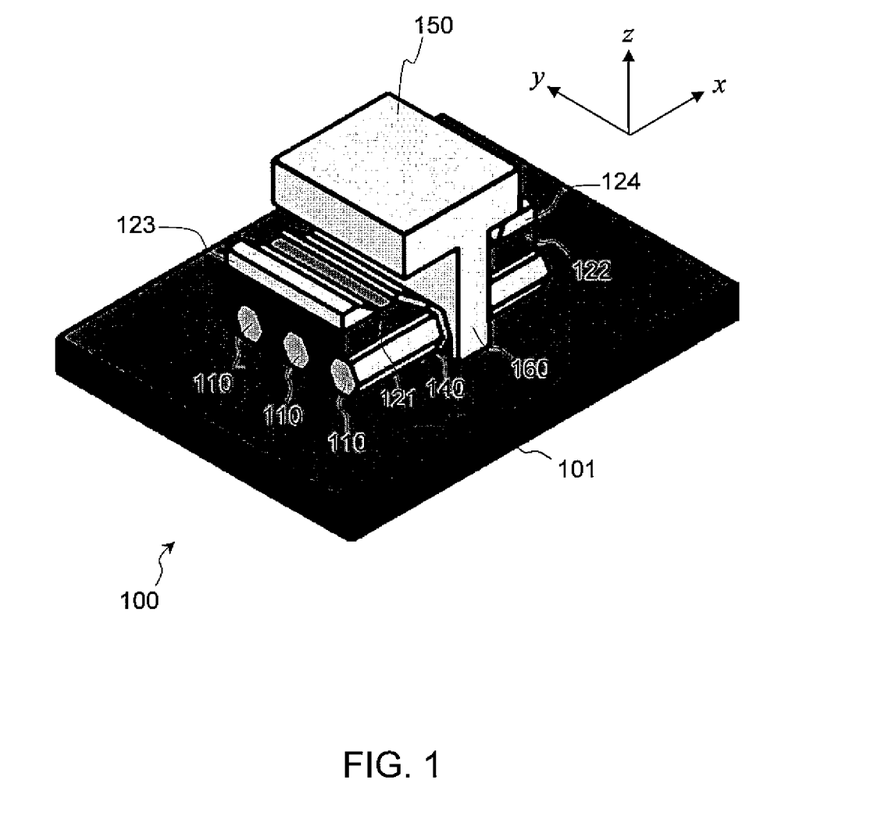
FIG. 1 is a 3D view of a field-effect transistor, as involved in embodiments of the present amplifier. This transistor includes three parallel channels, as in preferred embodiments. Note, the view is a cutaway drawing, in which part of the raised contacts are removed in order to better show one of the channels and the shape of the insulating layer.
Figure 2A:
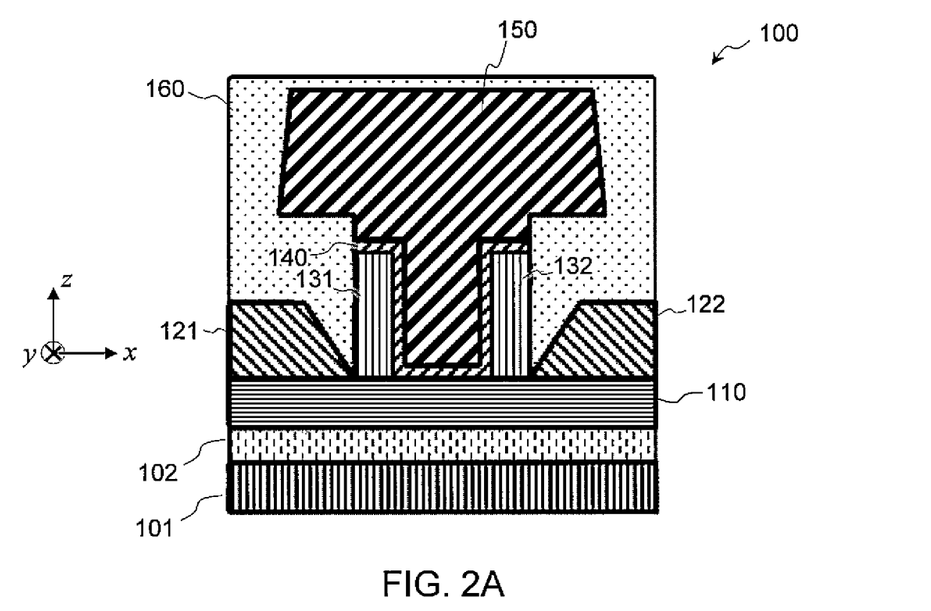
FIGS. 2A and 2B show longitudinal and transverse cross-sections of a transistor similar to that depicted in FIG. 1 (subject to minor design differences), at the level of a single channel, according to embodiments.
Figure 2B:
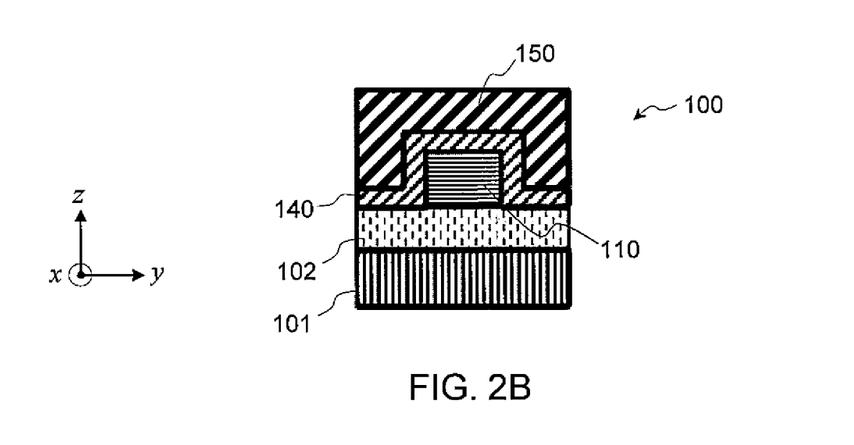
Figure 3A:
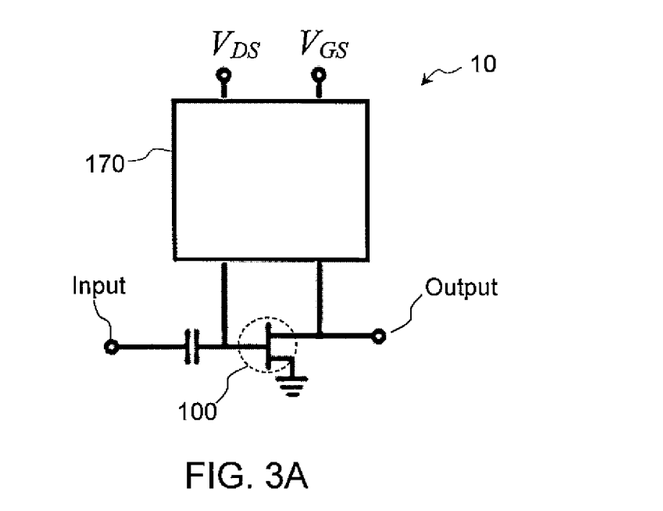
FIG. 3A is a high-level circuit diagram of an amplifier according to embodiments.

In reference to FIGS. 1-3B, an aspect is first described, which concerns an amplifier 10 (see FIG. 3A). The amplifier basically includes a field-effect transistor (see FIGS. 1, 2A, and 2B) and an electrical circuit to set the transistor and operate the amplifier, see FIGS. 3A and 3B.

The transistor 100 comprises one or more one-dimensional (1D) conduction channels 110 (as shown in FIG. 1). Assume a single channel is involved for now. This channel 110, which comprises a semiconductor material, is meant for conducting electrons along a main direction of the channel 110. Note, this direction is parallel to axis x in the accompanying drawings. The main direction of the channel 110 is otherwise perpendicular to its transverse cross-section (see FIG. 2B), which is itself parallel to the (y, z) plane in the drawings. Conversely, the main direction of the channel is included in the longitudinal cross-section of the channel (see FIG. 2A), which cross-section is now parallel to the (x, z) plane.

Figure 5:
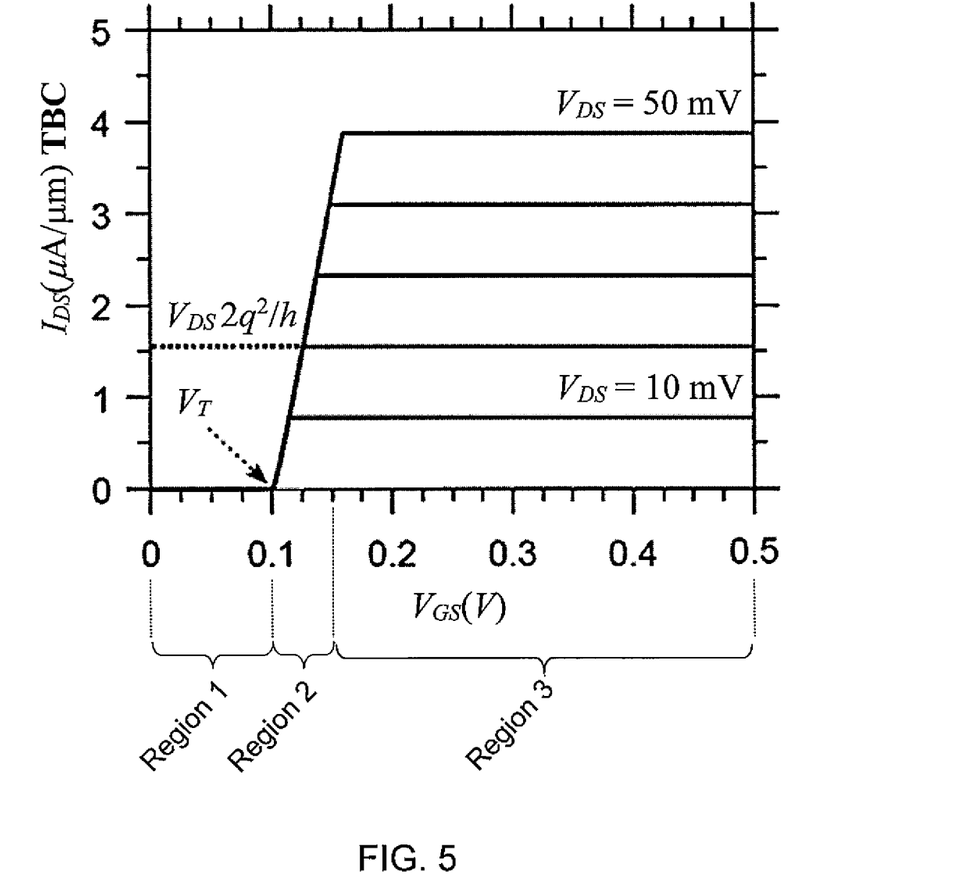
FIG. 5 is a plot representing ideal transfer characteristics of a 1D transistor channel with a single occupied sub-band, for different values of drain-to-source voltage ($V_{DS}$). The transition region (region 2) of the drain-to-source current ($I_{DS}$) rather has a sigmoid shape, yielding a gaussian-like peak such as seen in FIG. 6A.

In the present case, dimensions of said cross-section (i.e., its average diameter) are jointly designed with the semiconductor material of the channel, so as for the channel 110 to exhibit a quantized conduction of electrons along its main direction. This quantized conduction phenomenon translates into a staircase-like profile of conduction current, see FIGS. 5 and 6A.

The amplifier 10 further comprises an electrical circuit 170 to operate the transistor 100. More precisely, this circuit is configured to operate the transistor 100 at a value of gate-to-source voltage bias ($V_{GS}$), which corresponds to a peak value of a peak of a transconductance of the channel 110 with respect to gate-to-source voltage bias values. In detail, the transconductance is closely related to the current gain of the drain-to-source current (hereafter $I_{DS}$). It represents a change of $I_{DS}$ divided by a change in $V_{GS}$ with a constant drain-to-source voltage ($V_{DS}$). Thus, the transconductance can be computed as the derivative of the $I_{DS}$ with respect to $V_{DS}$.

That the channel 110 exhibits quantized conduction means that the drain-to-source current $I_{DS}$ of the channel has a step-like or staircase profile when plotted against $V_{GS}$, at constant $V_{DS}$. The "treads" of this profile are the essentially flat regions (see FIGS. 5, 6A), which can be associated to conduction sub-bands. While the "risers" of the steps would ideally have a straight profile (FIG. 5), they actually have a sigmoid shape (very much like the error function), whose derivative yields a gaussian-like peak, as depicted in FIG. 6A.

Figure 6A:
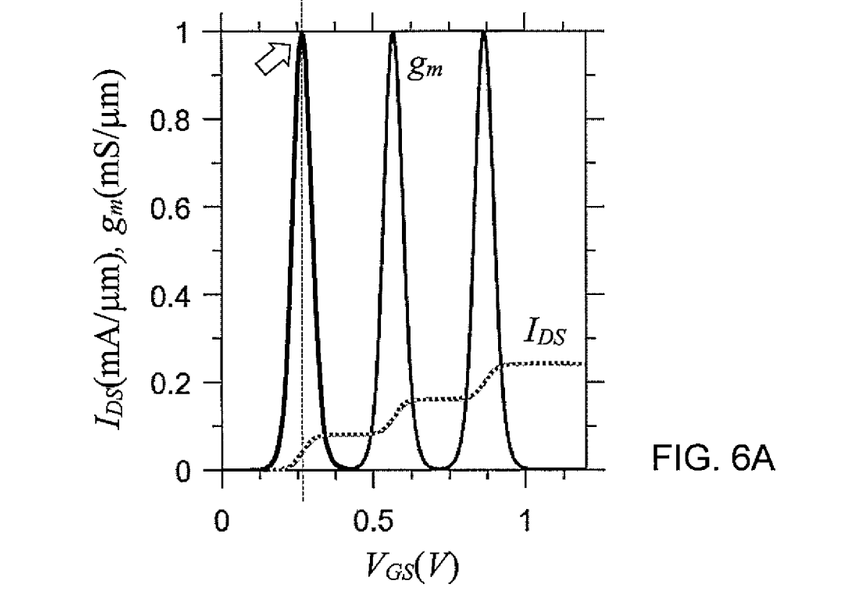
FIG. 6A is a plot depicting transconductance peaks as obtained from a staircase-like (quantized) current $I_{DS}$, having sigmoid transitions. A voltage value corresponding to a peak (maximal) value of one of these peaks is exploited to operate an amplifier with a 1D transistor channel, according to embodiments.

The peak value of the transconductance peak corresponds to a value of $V_{GS}$ in the riser region, i.e., the transition to/from a plateau (flat region) of $I_{DS}$, see FIG. 6A. Much preferred is to set the amplifier 10 to operate it at a bias point corresponding to a transition to/from the first tread plateau, for reasons discussed later. A "peak value" corresponds to a value substantially at or close to the apex of the transconductance peak, i.e., at or close to a maximal value of the peak, as indicated by a block arrow in FIG. 6A.

As usual, the amplifier 10 may further include a gain control circuit, in which said transistor 100 may be integrated (as well as the electrical circuit 170), and an impedance matching network. In fact, both the gain control circuit and the impedance matching network can be regarded as forming part of a same electrical circuit, as assumed for the electrical circuit 170 of FIG. 3A.

The present amplifier is operated close to a quantized step, in order to maximize the transconductance $g_m$ and thus the ratio $g_m/I_{DS}$, and, this, at reduced power compared to standard technology. This amplifier may advantageously be embodied as a cryogenic, low-noise amplifier (hereafter LNA). The proposed amplifier is able to markedly exceed the noise performance of traditional amplifiers, while also dissipating less power, in particular when operated at cryogenic temperatures. This makes it ideal for a variety of cryogenic applications, starting with quantum computer.

All this is now described in detail, in reference to particular embodiments of the invention. To start with, the electrical circuit 170 is much preferably configured to operate the transistor 100 at a value of $V_{GS}$ corresponding to a peak value of the first transconductance peak of the channel 110. Note, in terms of physics, the first peak can be associated to a first conduction sub-band of the semiconducting channel 110. Analytically, it corresponds to that transition of $I_{DS}$ (the sigmoid riser) leading to the first plateau of $I_{DS}$, when plotted against $V_{GS}$. In other words, this is the transconductance peak obtained at lowest $V_{GS}$ values, and for lowest (yet non-zero) $I_{DS}$ values, which makes it possible to achieve even higher values of $g_m/I_{DS}$.

A tracking circuit may be provided (e.g., as part of the circuit 170, FIG. 3A) to identify the exact voltage of the transconductance peak and accordingly set the amplifier. That is, the electrical circuit 170 may include a tracking circuit configured to identify said value of $V_{GS}$ and set the amplifier 10 for it to operate at the identified gate voltage bias. This tracking circuit may for example track a step-like profile, or any non-linear behavior of $I_{DS}$. Such a tracking circuit can be advantageously exploited in a variety of applications, e.g., cryogenic applications, including the qubit technology itself.

Figure 3B:
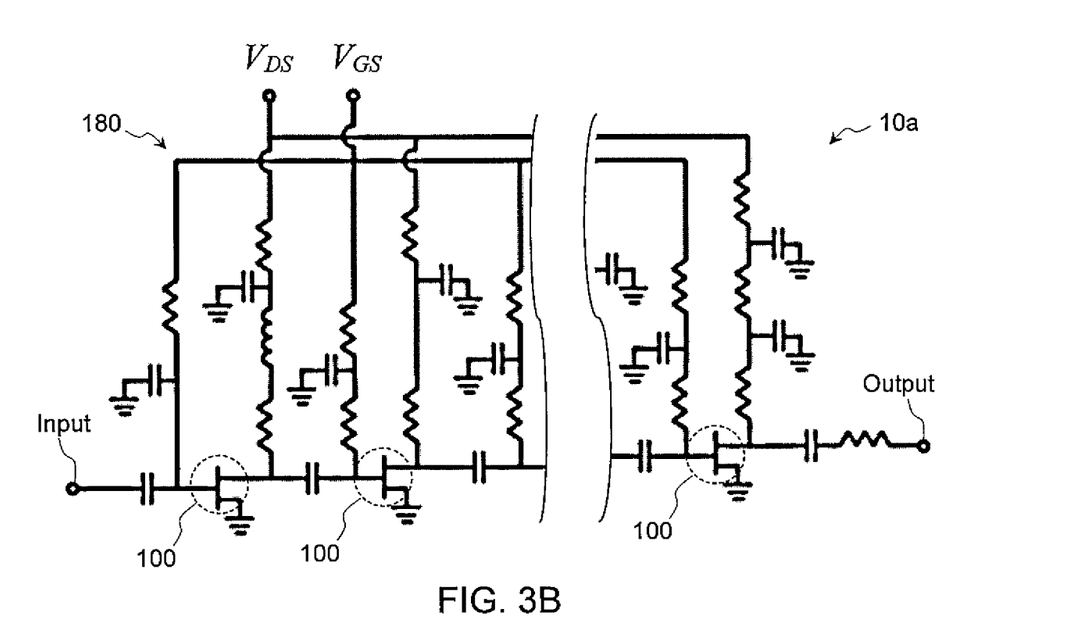
FIG. 3B is a circuit diagram of a multistage, low-noise amplifier, as involved in embodiments.

The amplifier 10 is preferably configured as an LNA. FIG. 3B shows an example of a multistage LNA 10a, including multiple transistors 100 in common-source configuration, together with an impedance matching network 180. Various other circuit layouts can nevertheless be contemplated, which may for instance use different transistor 100 topologies (e.g., common-drain or common-gate), as the skilled person may acknowledge. The circuit of the impedance matching network 180 will likely form part of a larger circuit (e.g., the circuit 170 in FIG. 3A), to operate the amplifier. Note, a quantized LNA has low linearity due to the narrow $g_m$ peak. This, however, is not an issue for applications such as contemplated herein (e.g., quantum computer applications), owing to the extremely low input power used.

The transistor 100 may possibly comprise several channels, i.e., 1D channels 110, for conducting electrons along respective directions of the channels. For example, the transistor 100 may include three parallel channels, as assumed in FIG. 1. Each channel 110 is similar to the 1D channel described earlier, i.e., dimensions of respective cross-sections of the channels are jointly designed with their respective semiconductor material for the channels 110 to exhibit quantized conduction along their respective directions. Note, in that case, the electrical circuit 170 may be configured to operate the transistor 100 at a same value of $V_{GS}$, which value corresponds to a peak value of a peak of a transconductance of each of the channels 110.

In embodiments, the channel(s) comprise(s) a III-V semiconductor material. Such materials have larger Bohr radii, allowing quantized conduction for larger dimensions (all things otherwise equal). This, in turn, makes it easier to process channels 110 that exhibit quantized conduction. In practice, the average dimension (diameter) of the cross-section of the channel(s) will typically be less than or equal to 30 nm. The channel may for example have a 30 nm×30 nm square cross-section, or a circular cross-section with a diameter of 30 nm.

The distance between the source 121 and drain 122 doped semiconductors is the gate length. It normally should be minimized in order to observe quantized conduction. Here, the gate length will typically be shorter than 40 nm in practice. The source and drain spacers 131, 132 reduce parasitic capacitances and are typically 5-20 nm wide. The width of the gate metal 150 is typically between 100 and 500 nm. The thickness of the insulator 140 will typically be between 2 and 5 nm.

The III-V semiconductor material may for example comprise or consist of InGaAs. As illustrated in FIGS. 1-2B, the transistor 100 may notably include a substrate 101, e.g., silicon, where a layer of said semiconductor material (e.g., InGaAs) extends on top of the substrate 101 and is structured so as to form said channel(s) 110. In this example, the transistor 100 further includes an insulating layer portion 140 (e.g., $Al_2O_3$ or $HfO_2$), at least partly in contact with the semiconductor material of the channel(s) 110 (see FIGS. 2A and 2B). Raised contact layer portions 121, 122 (i.e., source and drain contacts) extend on top of the channels 110, on opposite sides of the insulating layer portion 140. For instance, in the upper plane of the channel 110 (see FIG. 2A), the raised contacts 121, 122 extend on each side of the part of the insulating layer portion 140 that comes into contact with the channel 110. A dielectric material 160 (not shown in FIG. 1) covers the raised portions 121, 122.

Note, both the channel and raised contacts 121, 122 may comprise a III-V semiconductor material. However, this material will normally differ at least in an amount of respective dopants (for instance the contacts 121, 122 may be doped at a doping density of $1\times10^{19}$ $cm^{-3}$ with Sn, while the channel 110 is not intentionally doped). The materials may else differ in the stoichiometry of elements involved in the III-V material, if not in the elements themselves. In variants, different semiconductor materials may be relied on. The contact layers 121, 123 are likely covered with contact metals (e.g., Ti, Pd, or Au) 123, 124, as seen in FIG. 1.

The gate metal 150 preferably includes Ti, Pd, Au, Cu, and/or TiN. The gate metal is embedded in the dielectric material 160. As seen in FIG. 2A, the gate metal may have a T-shaped section, extending downwardly, so as to reach the bottom part of the insulating layer portion 140 that covers the channel 110 (FIGS. 2A, 2B). The transistor 100 may otherwise include spacers 131, 132 protruding from the semiconductor layer of the channels 110 and extending laterally along sidewalls of the insulating layer 140, between the raised contacts 121, 122. The spacers may for example comprise air or $SiN_x$. The role of the insulating spacers is to prevent undesired capacitive coupling between the source/drain and the gate.

The III-V channels are preferably bonded on a residual oxide layer 102 of a buried oxide layer formed on the substrate 101. The fabrication of the device 100 may otherwise be achieved thanks to usual processing techniques. As an example, the 1D channels 110 are formed either by selective epitaxial growth using a template to mask the growth, or by etching the 1D channels using an etch mask. A region of the 1D channels, defining the gate length, is subsequently masked, after which epitaxial growth of the raised source and drain contact 121,122 is performed. The gate stack 131, 132, 140, 150 can be formed in a self-aligned manner using a standard replacement gate metal process. Finally, the transistor is metallized.

Figure 4:
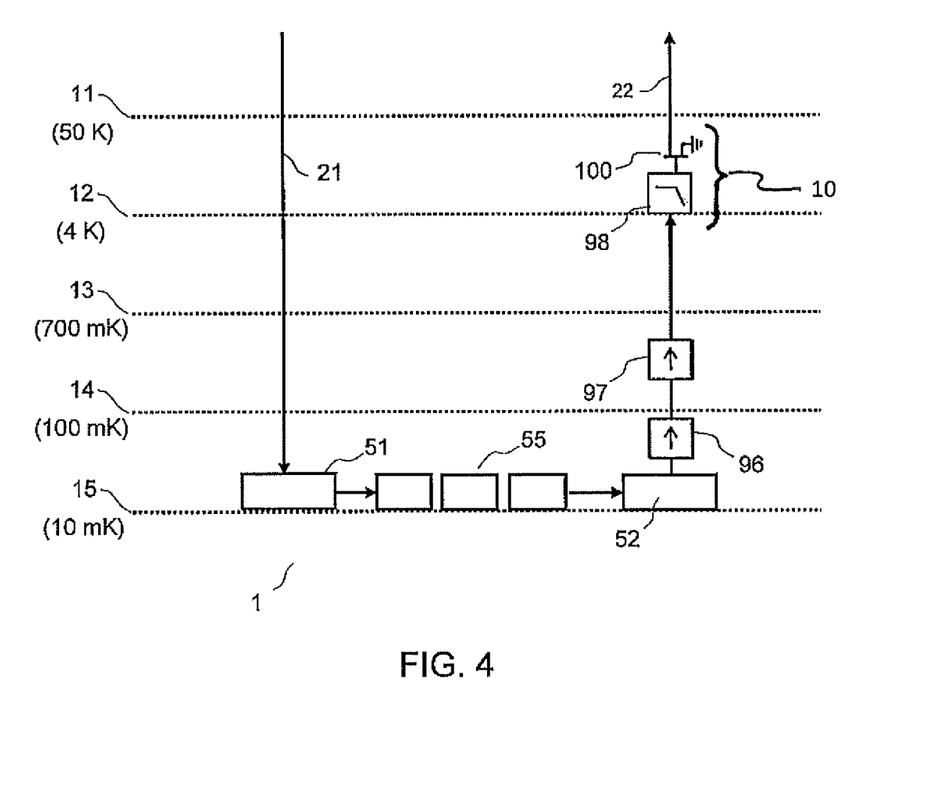
FIG. 4 is a block diagram that schematically illustrates selected components of a quantum computer hardware apparatus with several successive temperature platforms (stages). Superconducting qubits are arranged in the last (bottom) stage, while signal generators (not shown) generate radio frequency (RF) signals to drive the qubits. An amplifier such as shown in FIG. 2 is involved on the return path to amplify signals returned from the qubit (for readout purposes), as in embodiments.

According to another aspect, the invention can be embodied as an apparatus 1, as now discussed in reference to FIG. 4. The apparatus may comprise one or more amplifiers 10 such as described above in reference to the first aspect of the invention. I.e., each amplifier involves a field-effect transistor 100 with one or several 1D channels (e.g., nanowires, arranged in parallel), whose cross-sectional dimensions are such that the semiconductor material of the channels 110 exhibit quantized conduction along the directions of the channels. One or more electrical circuits 170 are used to operate the transistor(s) 100 at a certain value of $V_{GS}$, as explained earlier. Each amplifier 10 is configured to amplify signals transmitted in or by the apparatus 1, in operation.

The apparatus 1 may for example be a quantum computer hardware apparatus 1 comprising superconducting qubits 55, as assumed in FIG. 4. The amplifiers 10 are likely configured as low-noise amplifiers in that case. One or more amplifiers 10 may be used to amplify RF signals transmitted to or from components of the apparatus 1.

As illustrated in FIG. 4, one such amplifier 10 may for example be arranged on a return signal path 22, so as to amplify radio-frequency (RF) signals returned from one or more qubits 55, in operation. To that aim, amplifiers 10 may have to be operated at a temperature of less than or equal to 10 K. E.g., such an amplifier may for example be used on the 4 K stage 12 of the quantum computer hardware apparatus 1, as assumed in FIG. 4. While any RF signal may a priori be used (i.e., signals within $3 \times 10^5$ to $3 \times 10^{11}$ Hz), such signals shall preferably be microwave signals (i.e., signals whose frequencies are between $3 \times 10^8$ and $3 \times 10^{11}$ Hz) and more preferably be in the frequency range extending from 4 to 8 GHz.

As explained earlier, the LNAs 10 can be operated so as to minimize the noise temperature. Maintaining low noise and low power dissipation is a key issue in quantum computer applications, especially in highly scaled quantum computers. Irrespective of the actual qubit technology utilized, LNAs 10 may advantageously be used, in particular in output of the qubit block 55, to improve noise performance.

In detail, a LNA as proposed herein will likely seek to minimize the minimum noise temperature, defined as:

$$T_{min} \approx 2 \frac{f}{f_T} \sqrt{R_t T_g T_d G_d}$$

Where f is the operating frequency, $f_T$ is the cut-off frequency, $R_t=R_i+R_s+R_g$ ($R_i$ is the intrinsic gate to source resistance, while $R_s$ and $R_g$ are the parasitic source and gate resistances), $G_d$ is the output conductance and $T_g$, $T_d$ are the equivalent gate and drain temperatures, respectively. Note, $T_d$ is proportional to the drain current $I_{DS}$, and $f_T$ is proportional to the transconductance $g_m$, such that thus $g_m/I_{DS}$ must be maximized. This can be achieved with a LNA as described herein. Namely, for a 1D ballistic conductor, the source-drain current per sub-band is $$I_{DS} = \frac{2qk_BT}{h}\left[\mathcal{F}_0(\eta_F) + \mathcal{F}_0\left(\eta_F - \frac{qV_{DS}}{k_BT}\right)\right],$$

where T is the ambient temperature, $\mathcal{F}_n$, is the nth order Fermi-Dirac integral, $V_{DS}$ is the applied drain bias and $\eta_F=(E_F-E_x)/k_BT$ ($E_F$ is the Fermi-level and $E_x$ is the energy of the sub-band). As seen in FIG. 6A, quantization of the conductance due to sub-band splitting in a 1D channel 110 causes the formation of current plateaus. Transition regions at the edge of such a plateau give rise to a $g_m$ peak. As said, a preferred point of operation for a quantized LNA is at the first of these peaks, so as to minimize $I_{DS}$ and thus maximize $g_m/I_{DS}$.

Figure 6B:
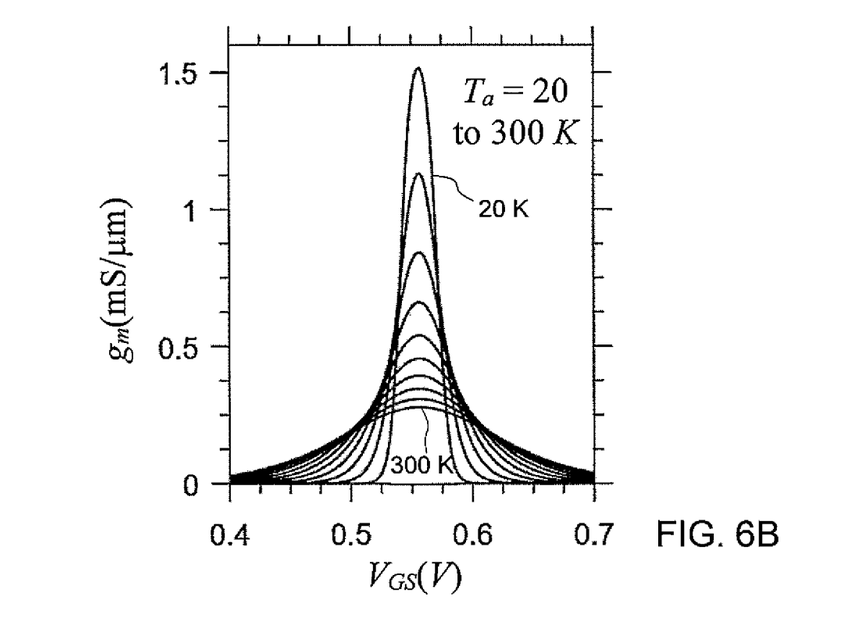
FIG. 6B illustrates effects of quantization on the transconductance, for a value of $V_{DS}$=50 mV.

Various simulations (some of these are reflected in FIGS. 6A and 6B) as well as experiments have been performed, which confirm the boosting effect of the quantized conductance on the transconductance. According to results obtained, the ratios $g_m/I_{DS}$ that can be obtained in the present context is essentially similar to that obtained with state-of-the-art cryogenic HEMTs, except that up to 16 times less power is used to operate the amplifiers.

Substantial performance improvement can be expected at very low temperature, e.g., down to less than 10 K. Indeed, additional experiments were conducted, which have shown that up to 5 to 10 times higher ratios of $g_m/I_{DS}$ ratios can be observed, for a 3 to 5 times lower minimum noise temperature. It has been concluded that the amplification scheme may possibly cause 20 to 100 times lower power dissipation. In comparison, relatively small progresses have been made with cryogenic HEMTs in the last decade.

The apparatus 1 may for example comprise a first stage 11 (e.g., a 50 K stage) connected to one or more signal generators (not shown), a last stage 15 with superconducting qubits 55 arranged therein. This stage 15 is normally adapted to be cooled down at a much lower temperature than the first stage e.g., to 10 mK. The signal generators are configured to generate RF signals to drive the qubits 55. Intermediate stages 12-14 are provided between the first stage 11 and the last stage 15. Such intermediate stages comprise elements such as attenuators (not shown) for thermalizing RF signals from the signal generators. Additional attenuators 51, 52 may be used on the last stage 15, both in input and output of the qubit block 55. An amplifier 10 such as described above may notably be used on an intermediate stage 12, for readout purposes, in order to amplify extremely low-power RF signals (~5 GHz) returned from the qubits 55.

In a typical configuration, the pump signal (not shown) and the qubit readout signal are fed into a circulator (not shown), i.e., a passive microwave device. The signals are then fed e.g., via isolators and a low pass filter into the LNA 10, to amplify the readout signal.

In variants, the signal generation may be moved down further into the cryostat 15. Yet, signals would still be amplified on the return path 22, whence the benefit of the present amplifiers.

The superconducting qubits are preferably of the transmon type. The apparatus 1 may further comprise additional RF-controlled components, such as (tunable) couplers (e.g., frequency-tunable coupling elements). That is, qubits 55 may possibly be connected to one or more tunable couplers (i.e., couplers that contain non-linear elements for its frequency to be tunable), e.g., to allow transitions between states of the qubits to be parametrically driven, by modulating the tunable coupler energy. For example, two-qubit gates are known, which are implemented with transmon (fixed-frequency) qubits, where the qubits are coupled via such a frequency-tunable coupler. The latter is typically not meant to be used as a computational qubit. However, a tunable coupler can practically be embodied as a superconducting qubit. In variants, fixed-frequency couplers may be used.

Such couplers are assumed to form part of the block shown as qubit 55 in FIG. 4. In fact, the elements in the block shown as qubit 55 may likely include multiple qubits and couplers between them, as well as other elements. As said, the couplers may have a fixed frequency or may contain non-linear elements to make them tunable. One method is to use Josephson junctions as non-linear elements and to tune them using an external magnetic field. In variants, a capacitive coupling may be relied upon. Other couplers may be used for different purposes. For example, a DC drive may be involved on a downward path to a Josephson parametric amplifier (JPA, not shown), e.g., a low noise JPA, which typically involves a tunable adjustment scheme for its center frequency, used to adjust and optimize the amplifier on the qubit frequencies.

Figure 7:
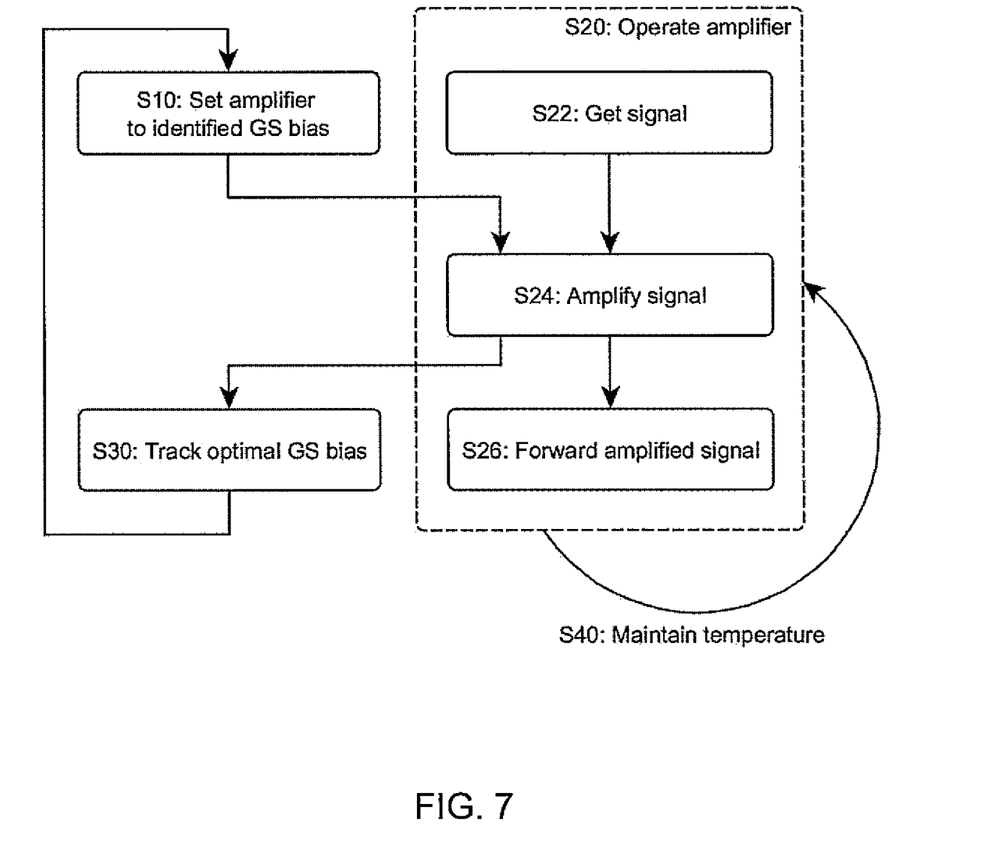
FIG. 7 is a flowchart illustrating high-level steps of a method of operating an amplifier according to embodiments.

Referring now more specifically to FIG. 7, another aspect of the invention is described, which concerns a method of operating an amplifier 10. The present method and its variants are collectively referred to as the "present methods". Main aspects of such methods have implicitly been addressed before and are therefore only briefly described in the following.

First, the present methods rely on an amplifier 10 such as described earlier, i.e., including a transistor 100 with a 1D channel 110 comprising a semiconductor material for conducting electrons along a main direction thereof, where this direction is perpendicular to the cross-section of the channel. And again, dimensions of this cross-section are, together with said semiconductor material, such that the channel 110 exhibits quantized conduction of electrons along its main direction.

According to such methods, the amplifier 10 is operated S20 at a value of gate-to-source voltage bias $V_{GS}$ corresponding to a peak value of a peak of a transconductance of the channel 110 with respect to gate-to-source voltage bias values. As said, the amplifier 10 is preferably operated 820 at a value of $V_{GS}$ corresponding to a first peak of transconductance, which can itself be associated to a first conduction sub-band of the semiconductor material, as explained earlier.

In practice, this value of $V_{GS}$ may be identified S30 prior to setting S10 the amplifier 10 for it to operate at the identified value of $V_{GS}$. In fact, the method may involve tracking S30 an optimal value of $V_{GS}$, as previously explained. Now, in some applications, the optimal bias point may be known and constant, such that a tracking circuit is optional.

As previously discussed too, the amplifier 10 may possibly have to be operated S20, S40 at a temperature of less than or equal to 10 K, notably in quantum computer applications. In such cases, the amplifier 10 may be operated S20 so as to amplify S24 a superconducting qubit readout signal of a quantum information processing apparatus 1, e.g., a signal returned 822 from qubits 55, amplified S24, and then forwarded S26 to an upper stage of the apparatus 1, as described earlier in reference to previous aspects of the invention.

An amplifier comprises a field-effect transistor having a one-dimensional channel comprising a semiconductor material for conducting electrons along a main direction of the channel, the main direction perpendicular to a cross-section of the channel, wherein dimensions of said cross-section are, together with said semiconductor material, such that the channel exhibits quantized conduction of electrons along said main direction; and an electrical circuit configured to operate the transistor at a value of gate-to-source voltage bias corresponding to a peak value of a peak of a transconductance of the channel with respect to gate-to-source voltage bias values.

The electrical circuit may be configured to operate the transistor at a value of the gate-to-source voltage bias corresponding to a peak value of a first peak of transconductance of the channel, the first peak corresponding to a first conduction sub-band of the semiconductor material. The electrical circuit may comprise a tracking circuit configured to identify the value of gate-to-source voltage bias and set the amplifier for it to operate at the identified gate voltage bias. The amplifier may be a low-noise amplifier. The transistor may comprise two or more one-dimensional channels for conducting electrons along respective main directions of the channels, wherein each of the channels is similar to the one-dimensional channel, wherein dimensions of respective cross-sections of the channels are, together with their respective semiconductor material, such that the channels exhibit, each, quantized conduction of electrons along their respective main directions, and the electrical circuit may be configured to operate the transistor at a same value of gate-to-source voltage bias corresponding to a peak value of a peak of a transconductance of each of the channels. The amplifier may be adapted to be operated at a temperature of less than or equal to 10 K. An average dimension of the cross-section may be less than or equal to 30 nm. The semiconductor material may comprise a III-V semiconductor material. The III-V semiconductor material may comprise InGaAs. The transistor may include a substrate, a layer of the semiconductor material extending on top of the substrate and structured so as to form the channel, and the transistor may further include an insulating layer portion in contact with the semiconductor material layer; raised source and drain contact layer portions extending on top of the channel, on opposite sides of the insulating layer portion; a dielectric material covering the raised source and drain contact layer portions; and a gate metal embedded in the dielectric material and reaching the insulating layer portion. The gate metal may comprise one or more of: Ti, Pd, Au, Cu, and TiN. The insulating layer portion may comprise one or each of $Al_2O_3$ and $HFO_2$. The amplifier may further comprise spacers protruding from the semiconductor layer and extending laterally along sidewalls of the insulating layer portion, between the raised source and drain contact layer portions. The semiconductor material and the raised source and drain contact layer portions may comprise, each, a III-V semiconductor material, differing at least in an amount of dopants.

An apparatus, comprising one or more amplifiers as described above is configured to amplify signals transmitted in or by the apparatus, in operation thereof.

The apparatus may be a quantum computer hardware apparatus comprising superconducting qubits. The at least one of the amplifiers may be a low-noise amplifier. At least one of the amplifiers may be arranged on a return signal path, so as to amplify radio-frequency signals returned from one or more of the qubits, in operation.

A method of operating an amplifier comprises providing an amplifier including a field-effect transistor having a one-dimensional channel comprising a semiconductor material for conducting electrons along a main direction of the channel, the main direction perpendicular to a cross-section of the channel, wherein dimensions of said cross-section are, together with said semiconductor material, such that the channel exhibits quantized conduction of electrons along said main direction; and operating the amplifier at a value of gate-to-source voltage bias corresponding to a peak value of a peak of a transconductance of the channel with respect to gate-to-source voltage bias values.

The amplifier may be operated at a value of the gate-to-source voltage bias corresponding to a peak value of a first peak of transconductance of the channel, the first peak corresponding to a first conduction sub-band of the semiconductor material. The method may further comprise identifying the value of gate-to-source voltage bias prior to setting the amplifier for it to operate at the identified value of gate-to-source voltage bias. The amplifier may be operated at a temperature of less than or equal to 10 K. The amplifier may be operated so as to amplify a superconducting qubit readout signal of a quantum information processing apparatus.

While the present invention has been described with reference to a limited number of embodiments, variants and the accompanying drawings, it will be understood by those skilled in the art that various changes may be made and equivalents may be substituted without departing from the scope of the present invention. In particular, a feature (device-like or method-like) recited in a given embodiment, variant or shown in a drawing may be combined with or replace another feature in another embodiment, variant or drawing, without departing from the scope of the present invention. Various combinations of the features described in respect of any of the above embodiments or variants may accordingly be contemplated, that remain within the scope of the appended claims. In addition, many minor modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims. In addition, many other variants than explicitly touched above can be contemplated.

What is claimed is:

1. An amplifier comprising:
    a field-effect transistor having a one-dimensional channel comprising a semiconductor material for conducting electrons along a main direction of the one-dimensional channel, the main direction perpendicular to a cross-section of the one-dimensional channel, wherein dimensions of said cross-section are, together with said semiconductor material, such that the one-dimensional channel exhibits quantized conduction of electrons along said main direction; and
    an electrical circuit configured to operate the transistor at a value of gate-to-source voltage bias corresponding to a peak value of a peak of a transconductance of the one-dimensional channel with respect to gate-to-source voltage bias values;
    wherein the operation of the transistor is at a constant drain-to-source voltage such that the transconductance is a ratio of a drain-to-source current to the gate-to-source voltage that produces a sigmoid shaped function.

2. The amplifier according to claim 1, wherein
the electrical circuit is configured to operate the transistor at a value of the gate-to-source voltage bias corresponding to a peak value of a first peak of transconductance of the one-dimensional channel, the first peak corresponding to a first conduction sub-band of said semiconductor material.

3. The amplifier according to claim 1, wherein
said electrical circuit comprises a tracking circuit configured to identify said value of gate-to-source voltage bias and set the amplifier for it to operate at the identified gate voltage bias.

4. The amplifier according to claim 1, wherein
said amplifier is a low-noise amplifier.

5. The amplifier according to claim 1, wherein
said transistor comprises two or more one-dimensional channels for conducting electrons along respective main directions of the one-dimensional channels, wherein each of the one-dimensional channels is similar to others of said one-dimensional channels, wherein dimensions of respective cross-sections of the one-dimensional channels are, together with their respective semiconductor material, such that the one-dimensional channels exhibit, each, quantized conduction of electrons along their respective main directions, and
said electrical circuit is configured to operate the transistor at a same value of gate-to-source voltage bias corresponding to a peak value of a peak of a transconductance of each of the one-dimensional channels.

6. The amplifier according to claim 1, wherein
said amplifier is adapted to be operated at a temperature of less than or equal to 10 K.

7. The amplifier according to claim 1, wherein
an average dimension of said cross-section is less than or equal to 30 nm.

8. The amplifier according to claim 1, wherein
said semiconductor material comprises a III-V semiconductor material.

9. The amplifier according to claim 8, wherein
said III-V semiconductor material comprises InGaAs.

10. The amplifier according to claim 8, wherein:
said transistor includes a substrate,
a layer of said semiconductor material extends on top of the substrate and is structured so as to form said one-dimensional channel, and
the transistor further includes:
    an insulating layer portion in contact with the semiconductor material layer;

raised source and drain contact layer portions extending on top of the one-dimensional channel, on opposite sides of the insulating layer portion;

a dielectric material covering the raised source and drain contact layer portions; and a gate metal embedded in the dielectric material and reaching said insulating layer portion.

11. The amplifier according to claim 10, wherein
the gate metal comprises one or more of: Ti, Pd, Au, Cu, and TiN.

12. The amplifier according to claim 10, wherein
said insulating layer portion comprises one or each of $Al_2O_3$ and $HFO_2$.

13. The amplifier according to claim 10, wherein
the amplifier further comprises spacers protruding from the semiconductor layer and extending laterally along sidewalls of said insulating layer portion, between the raised source and drain contact layer portions.

14. The amplifier according to claim 10, wherein
said semiconductor material and the raised source and drain contact layer portions comprise, each, a III-V semiconductor material, differing at least in an amount of dopants.

15. An apparatus, comprising one or more amplifiers, each according to claim 1, wherein
each of the one or more amplifiers is configured to amplify signals transmitted in or by the apparatus, in operation thereof.

16. The apparatus according to claim 15, wherein
the apparatus is a quantum computer hardware apparatus comprising superconducting qubits.

17. The apparatus according to claim 16, wherein
said at least one of said amplifiers is a low-noise amplifier.

18. The apparatus according to claim 17, wherein
at least one of said amplifiers is arranged on a return signal path, so as to amplify radio-frequency signals returned from one or more of the qubits, in operation.

19. A method of operating an amplifier, wherein the method comprises:

providing an amplifier including a field-effect transistor having a one-dimensional channel comprising a semiconductor material for conducting electrons along a main direction of the one-dimensional channel, the main direction perpendicular to a cross-section of the one-dimensional channel, wherein dimensions of said cross-section are, together with said semiconductor material, such that the one-dimensional channel exhibits quantized conduction of electrons along said main direction; and operating the amplifier at a value of gate-to-source voltage bias corresponding to a peak value of a peak of a transconductance of the one-dimensional channel with respect to gate-to-source voltage bias values;

wherein the operation of the transistor is at a constant drain-to-source voltage such that the transconductance is a ratio of a drain-to-source current to the gate-to-source voltage that produces a sigmoid shaped function.

20. The method according to claim 19, wherein
the amplifier is operated at a value of the gate-to-source voltage bias corresponding to a peak value of a first peak of transconductance of the one-dimensional channel, the first peak corresponding to a first conduction sub-band of the semiconductor material.

21. The method according to claim 19, wherein
the method further comprises identifying said value of gate-to-source voltage bias prior to setting the amplifier for it to operate at the identified value of gate-to-source voltage bias.

22. The method according to claim 19, wherein
the amplifier is operated at a temperature of less than or equal to 10 K.

23. The method according to claim 19, wherein
the amplifier is operated so as to amplify a superconducting qubit readout signal of a quantum information processing apparatus.

* * * * *